United States Patent
Ikadai et al.

(10) Patent No.: US 6,780,290 B2
(45) Date of Patent: Aug. 24, 2004

(54) METHOD AND DEVICE FOR FORMING FILM

(75) Inventors: Masahiro Ikadai, Osaka (JP); Etsuo Ogino, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 10/357,526

(22) Filed: Feb. 3, 2003

(65) Prior Publication Data

US 2003/0132101 A1 Jul. 17, 2003

Related U.S. Application Data

(63) Continuation of application No. PCT/JP02/05262, filed on May 30, 2002.

(30) Foreign Application Priority Data

Jun. 4, 2001 (JP) .......................................... 2001-167648

(51) Int. Cl.$^7$ ............................. C23C 14/34; C23C 16/00
(52) U.S. Cl. ............................... 204/192.12; 204/298.23; 204/298.28; 118/723 VE; 118/730; 427/255.5; 427/592
(58) Field of Search ........................ 204/192.12, 298.28, 204/298.23; 427/255.5, 592; 118/723 VE, 730

(56) References Cited

U.S. PATENT DOCUMENTS 4,380,212 A * 4/1983 Kraus .......................... 118/720
5,616,224 A * 4/1997 Boling .................... 204/298.08
5,993,614 A 11/1999 Nomura ................... 204/192.12
6,171,462 B1 1/2001 Gries et al. ............. 204/298.15
6,402,902 B1 * 6/2002 Boling .................... 204/192.12

FOREIGN PATENT DOCUMENTS

| EP | 0 409 451 A1 | 7/1990 | ........... C23C/14/56 |
| JP | 61-110343 | 5/1986 | ............ G11B/5/85 |
| JP | 8-134642 | 5/1996 | ........... C23C/14/35 |
| JP | 09-78234 | 3/1997 | |
| JP | 11-61384 | 3/1999 | ........... C23C/14/24 |
| JP | 11-106902 | 4/1999 | ........... C23C/14/24 |
| JP | 10-298752 | 11/1999 | ........... C23C/14/34 |
| JP | 2000-64037 | 2/2000 | ........... C23C/14/34 |
| JP | 2000-265261 | 9/2000 | ........... C23C/14/24 |

* cited by examiner

Primary Examiner—Steven Versteeg
(74) Attorney, Agent, or Firm—Edwards & Angell, LLP; David G. Conlin, Esq.; Lisa S. Hazzard, Esq.

(57) ABSTRACT

The prevent invention improves the film thickness distribution in the direction of revolution of substrates by a simple manner in a method for forming coating films, wherein a evaporating source 3 is disposed at a predetermined distance from substrates 2, and when a coating film material is applied from the evaporating source 3 onto the substrate surfaces while revolving the substrates 2, coating films are formed on the substrate surfaces in a condition where the radius of curvature of the substrates 2 obtained by bending the substrates 2 within the elasticity range is made equal to the radius of revolution of the substrates 2.

14 Claims, 9 Drawing Sheets

F I G. 2
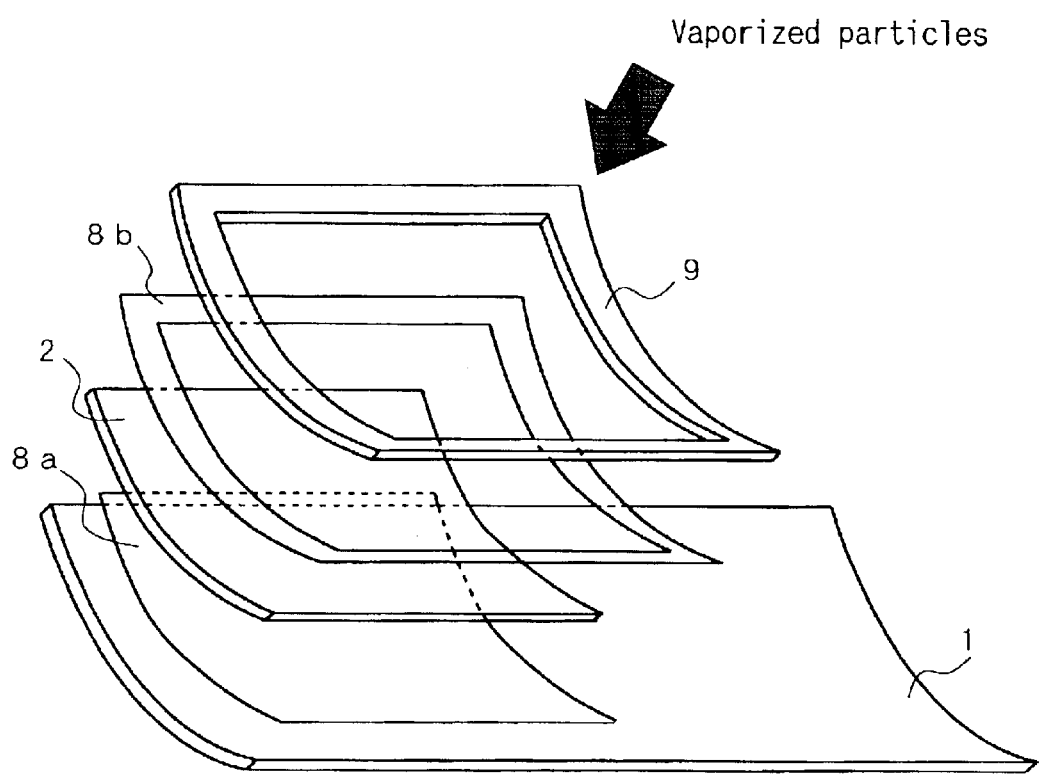

(a)

(b)

Revolution direction

Direction orthogonal to the direction of substrate revolution (a)

(b)

METHOD AND DEVICE FOR FORMING FILM

This application is a continuation of International Application PCT/JP02/05262 filed on May 30, 2002 and which designated the United States which claims priority from Japanese Patent Application No. 2001-167648 filed Jun. 4, 2001.

TECHNICAL FIELD

The present invention relates to a method for forming coating films such as a transparent electrical conductive film and reflective film on a substrate surface, more specifically, a coating film forming method and device by which evenness in coating film thickness is increased.

BACKGROUND ART

A method has been conventionally used in which substrates are attached to the inside surface or outside surface of a rotatable drum-shaped substrate holder, and coating film material particles are evaporated from a coating film material placed at a position opposite to the substrates while rotating the substrate holder, whereby coating films are formed on the substrate surfaces. As a method for forming coating films, vacuum evaporation method and sputtering method have been generally used.

FIG. 6 is a schematic view showing an example of such a vacuum evaporation device. In the vacuum evaporation device shown in FIG. 6, a plurality of substrates 2 are attached to the inner wall surface of a rotatable drum-shaped substrate holder 1, and while rotating the substrate holder 1, that is, while revolving the substrates 2, coating film material particles are evaporated from a coating film material (hereinafter, referred to as evaporating source 3) located at the revolution central position of the substrate holder 1, whereby coating films are formed on the surfaces of the substrates 2.

FIG. 7 is a partial sectional view showing disposition of the substrates and substrate holder of the vacuum evaporation device shown in FIG. 6.

Recently, formation of a coating film on a substrate having a great area has been demanded, on the other hand, uses of coating films have increased in which evenness in coating film thickness across the entire surface of the substrate with a great area is demanded. For example, such a technique achieving this is increasingly expected in uses for an electrical conductive film coated substrate, reflection preventive film coated substrate, reflective film coated substrate, a semi-transparent film coated substrate, electromagnetic shielding film coated substrate, and infrared ray shielding film coated substrate. Furthermore, these film-coated substrates are used for various displays including a liquid crystal display (LCD), organic electro luminescence (EL) display, and plasma display panel (PDP), and in addition, used for architectural members and vehicle members.

A film thickness is determined in accordance with the density on the substrate surface of coating film material particles reaching the substrate surface from the evaporating source within a unit time. The density on the substrate surface of the coating film material particles depends on the angle of inclination of the normal direction of the evaporating source surface with respect to the straight line linking the evaporating source and a specific position of the substrate surface, and depends on the distance between the evaporating source and substrate surface.

When it is assumed that the normal direction of the evaporating source surface is a solid angle of $\phi$=zero degrees, the density of coating film material particles which is evaporated in the direction of the solid angle $\phi$ follows the so-called cosine rule, and is in proportion to the n-power ($n \approx 1$ to 3) of $\cos \phi$.

The density of the coating film material particles to be evaporated is in inverse proportion to almost the square of the distance from the evaporating source. For example, the relationship of the density of the evaporated particles between point (a) with a d1 distance from the evaporating source and point (b) with a d2 distance from the evaporating source is roughly as follows:

density of evaporated particles at point (b)$\propto$
density of evaporated particles at point (a)/$(d2/d1)^2$ That is, the more distant from the evaporating source, the smaller the density of evaporated particles reaching the substrate. As a result, the film thickness on the substrate surface at a distant position from the evaporating source becomes thinner than that at a position close to the evaporating source.

In order to form a coating film thickness which is even across the entire substrate surface, a film thickness correcting plate has been conventionally provided between the evaporating source and substrate. The film thickness correcting plate has a function for making the film thickness even across the entire substrate surface by eliminating density differences of evaporated particles reaching the substrate caused by the solid angle from the evaporating source and/or the distance from the evaporating source and substrate and making the density even.

FIG. 6 shows a film thickness correcting plate 5 provided for improving the film thickness distribution in the direction orthogonal to the direction of revolution of the substrates 2 disposed on the inner wall surface of the drum-shaped substrate holder 1. The film thickness correcting plate is shaped so that, for example, as shown in the plan view of the film thickness correcting plate 5 of FIG. 8, the width is changed along the direction orthogonal to the direction of revolution of the substrates 2.

In the evaporation method using the vacuum evaporation device shown in FIG. 6, when the film thickness correcting plate 5 is not provided, a film thickness distribution is obtained in which the film thickness of a coating film formed at the position on the substrate surface at which the solid angle $\phi$ from the evaporating source 3 is great and the distance between the evaporating source 3 and substrate 2 is long becomes thinner than the thickness at a position on the substrate surface at which the solid angle $\phi$ from the evaporating source 3 is small and the distance between the evaporating source 3 and substrate 2 is short.

Since the film thickness correcting plate 5 shown in FIG. 8 is shaped so that the width decreases toward both ends, the number of evaporated particles shielded at the x portions at both ends is smaller than that shielded at the central y portion, so that the film thickness distribution of the coating films on the surfaces of the substrates 2 can compensate a deviation in the film thickness distribution occurring in the case where the abovementioned film thickness correcting plate is not provided.

In the Japanese Unexamined Patent Publication No. H11-061384, a evaporation method for forming coating films on the surfaces of the substrates 2 by using a vacuum evaporation device while revolving the substrates 2 is disclosed, and in said evaporation method, in order to make the film thickness on the surface of the substrate 2 even, for example, a film thickness correcting plate 6a roughly shaped into a polygon as shown in FIG. 11(a) and a film thickness correcting plate 6b shaped into a triangle plane as shown in FIG. 11(b) are used. In this publication, the substrates 2 are disposed so that the distances between the substrate 2 and the evaporating sources 3a and 3b are greatly different from each other at the entire surface of the substrate 2, so that the shapes of the film thickness correcting plates 6a and 6b and a disposition method for the plates to compensate the film thickness distribution due to the difference between the distances from the evaporating sources 3a and 3b are described.

However, in a method in which a coating film is formed while revolving the substrates 2 by means of the vacuum evaporation method, the film thickness correcting plates 5, 6a, and 6b used in the prior arts can improve a deviation in the film thickness distribution in the direction orthogonal to the direction of revolution of the substrates 2, however, these cannot improve a deviation in the film thickness distribution occurring in the direction of revolution of the substrates 2.

A deviation in the film thickness distribution due to the difference in the solid angle φ from the evaporating source 3 does not occur in the direction of revolution of the substrates 2. The time average of the solid angle φ between each position in the direction of revolution within the substrate surface and the evaporating source 3 becomes fixed at any position in the direction of revolution since the substrates 2 revolve.

However, there is a case where a deviation in the film thickness distribution occurs in the direction of revolution of the substrates 2 due to different distances from the evaporating source 3 although the solid angle φ is fixed, and such a deviation in the film thickness distribution cannot be solved by the prior arts in principle. The reason for occurrence of a deviation in the film thickness distribution in the direction of revolution of the substrates 2 due to a difference in distance from the evaporating source 3 even in a case of a constant solid angle φ is explained with reference to FIG. 9.

When one substrate 2 revolves in the direction of the arrow A in the figure, even when the solid angle φ from the evaporating source 3 is constant, the end (point (b)) of the substrate 2 in the direction of revolution and the center point (point (a)) of the substrate 2 in the direction of revolution are different in distance from the evaporating source 3. That is, point (a) and point (b) on the surface of one substrate 2 are always different in distance from the evaporating source 3 regardless of the solid angle φ.

Since the point (b) is always more distant from the evaporating source 3 than point (a), the thickness at point (b) is thinner than that at point (a). Therefore, in the film thickness distribution in the direction of revolution of the substrate 2, the thickness at the center portion of the substrate 2 is thick, and the thickness at the end portion is thin.

An object of the invention is to improve a deviation in the film thickness distribution occurring in the rotation direction such as the direction of revolution of the substrate in the abovementioned method for forming a coating film.

DISCLOSURE OF INVENTION

The abovementioned object of the invention is solved by the following constitution.

(1) A method for forming coating films, in which an evaporating source is provided at a predetermined distance from one or more substrates, and a coating film material from the evaporating source is applied on the substrate surfaces while revolving the substrates around the evaporating source, wherein coating films are formed on the substrate surfaces in a condition where the radius of curvature of the substrates obtained by bending the substrates within the elasticity range is almost equal to the radius of revolution of the substrates which rotate the substrates around the evaporating source.

The evaporating source may be disposed at a center of revolution of the substrates or in the vicinity of a center of the revolution of the substrates. The evaporating source also may be disposed at positions other than a center of revolution of the substrates or in the vicinity of a center of revolution of the substrates.

Although the evaporating source is generally disposed at the center of revolution of the substrate, even when the evaporating source is not disposed at the center of revolution, this does not influence the effects of the invention. When the evaporating source is not disposed at the center of revolution, as a matter of course, distances from the respective positions in the direction of revolution within the substrate to the evaporating source are different in the condition that the substrate is at rest, however, since the substrate revolves in this invention, the time average of the distance becomes constant at positions within the substrate in the direction of revolution.

The method using the evaporation material to evaporate the coating film material by heating under reduced pressure (the vacuum evaporation method) and the method using the target to evaporate the coating film material by the sputtering (the sputtering method) may be useful in the evaporating source.

(2) A method for forming coating films, in which coating film materials from an evaporating source is provided outside of one or more substrates, and coating film materials from the evaporating source are coated on the substrate surfaces while said one or more substrates are rotated.

In this case, the method using the evaporation material to evaporate the coating film material by heating under reduced pressure (the vacuum evaporation method) and the method using the target to evaporate the coating film material by the sputtering (the sputtering method) may also be useful in the evaporating source.

(3) A coating film forming device having an evaporating source arranged section for evaporating a coating film material, and a cylindrical substrate holder which holds one or more substrates to be coated with the coating film material from the evaporating source on the wall of the holder and revolves around the evaporating source arranged section and is disposed at a predetermined distance from evaporating source arranged section, wherein the radius of curvature of the substrates is almost equal to the radius of curvature of the wall surface on which the substrates of the cylindrical substrate holder are provided.

The material of the substrate holder may be selected by considering properties such as proper heat resistance, rigidity, less dust emission, and free from emission of gases within the vacuum device. Various kinds of metal materials such as stainless steel and aluminum are generally used.

A trim-shaped presser plate which is put and fixed the substrates together with the wall surface of the substrate holder, and has a radius of curvature that is almost equal to that of the substrates may be provided.

A protective sheet with hardness smaller than that of the substrate is deposited between the substrates and the wall surface of the substrate holder, and a trim-shaped protective sheet with hardness smaller than that of the substrates may be disposed between the substrate and the trim-shaped presser plate of the substrates.

The protective sheet and the trim-shaped protective sheet may be plastics.

Since the protective sheets prevent direct contact between the substrates and substrate holder, occurrence of flaws on the substrates can be prevented, and since the protective sheets have hardness smaller than that of the substrates, the protective sheets do not damage the substrates.

A coating film forming device according to the above-mentioned (3) is the device such that one or more substrates are provided on inner wall surface of the cylindrical substrate holder which rotates around rotation axis, and the evaporating source arranged section to evaporate the coating film material are provided at the cylindrical axis of substrate holder or in the vicinity of the cylindrical axis of substrate holder, or one or more substrates are provided on inner wall surface of the cylindrical substrate holder which rotates around rotation axis, and evaporating source arranged section to evaporate the coating film material are provided at positions other than the cylindrical axis of substrate holder or in the vicinity of the cylindrical axis of substrate holder.

(4) A coating film forming device having a rotational cylindrical substrate holder which holds one or more substrates at the outside wall surface, and the other cylindrical tube having the same rotational axis with the cylindrical substrate holder and larger rotational radius than the cylindrical radius of the substrate holder and an evaporating source arranged section to evaporate the coating film material at the inner surface are provided.

According to the invention, the radius of curvature of the substrates are almost equal to the radius of curvature of the wall surface of the cylindrical substrate holder on which the substrates are disposed, whereby the film thickness in the direction of substrate revolution from the evaporating source disposed at a predetermined distance from the rotating substrates becomes even.

In the invention, coating films are formed in a condition where the substrates are bent within the elasticity range, and thereafter, the substrates are restored to be plane. Internal stresses of the coating films obtained by the method of the invention are considered as follows.

In an embodiment of the invention, a stress inside the coating film caused by restoring the coating films that have been formed in a condition where the substrates 2 are bent to be plane is calculated as approximately 35 MPa (tension) based on the elasticity theory.

On the other hand, when the formed coating films are cooled to a normal temperature in a condition where the substrates 2 are heated, a stress inside the coating films caused by a difference between the thermal expansion coefficient of the glass substrate and thermal expansion coefficient of the coating films (for example, in the embodiment described later, the average thermal expansion coefficient of $SiO_2$ and $TiO_2$) is calculated as approximately 150 MPa (compression) based on the elasticity theory. This internal stress at the same level also occurs in the prior arts.

Furthermore, a stress inside the coating films caused by anisotropic distortion of the crystal lattice of the coating films on the substrates 2 is calculated as 200 through 1000 MPa (compression). This internal stress at the same level also occurs in the prior arts.

Thus, an internal stress of coating films caused by the method of the invention is approximately one digit smaller than that caused by anisotropic distortion of the crystal lattice of coating films in the prior arts, so that the level of the internal stress caused by the method of the invention does not need to be considered in practical use.

BRIEF DESCRIPTION OF THE DRAWINGS

FIG. 2 is an assembly drawing of members to be attached in a condition where a substrate is attached to a substrate holder in a bent condition in the embodiment of the invention;

BEST MODE FOR CARRYING OUT THE INVENTION

An embodiment of the invention is explained with reference to the accompanying drawings.

The embodiment of the invention also uses a vacuum evaporation device, in which a plurality of substrates 2 are attached to the inner wall surface of a drum-shaped substrate holder 1 that can revolve, and while rotating the substrate holder 1, coating film material particles are evaporated from a coating film material (evaporating source 3) located at the revolution center position of the substrate holder 1, whereby coating films are formed on the surfaces of the substrates 2.

Figure 1:
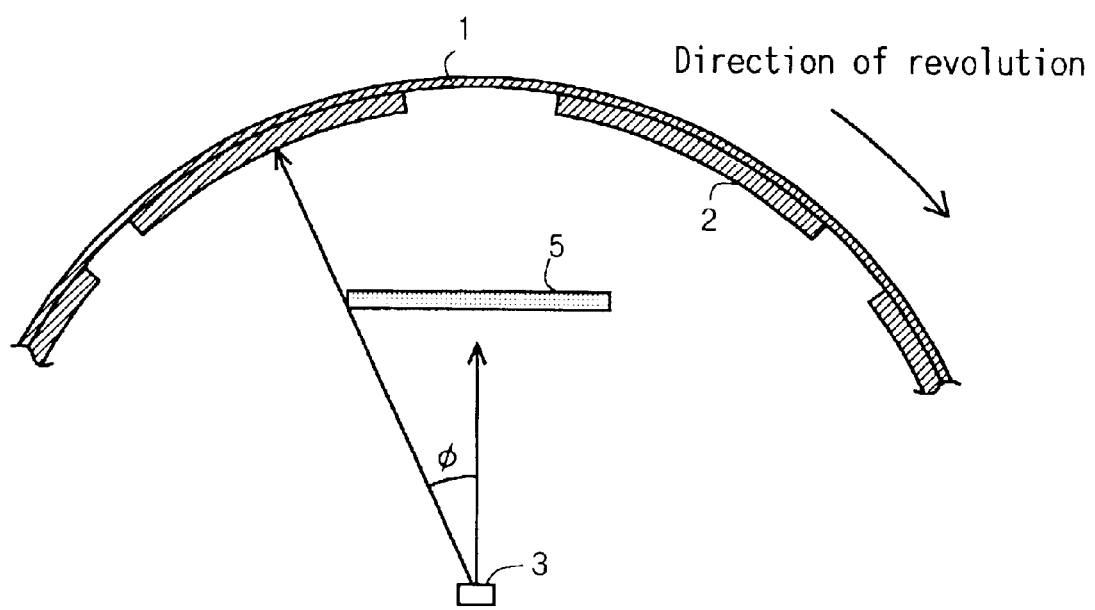
FIG. 1 is a drawing for explaining the method for forming coating films by means of the vacuum evaporation method used in an embodiment of the invention, showing a partial sectional view of a vacuum evaporation device of FIG. 6.

FIG. 1 shows the disposition relationship between the substrates 2 and substrate holder 1 in the coating film forming method by means of the vacuum evaporation method used in the embodiment of the invention.

As shown in FIG. 1, by closely adhering the substrates 2 to the inside surface of the cylindrical substrate holder 1, the substrates 2 are attached in a bent condition so that the substrates have the same radius of curvature as that of the substrate holder 1.

Thereby, the distance from the evaporating source 3 to the substrate 2 is prevented from changing together with a position in the direction of revolution within one substrate 2, and this distance can be always made fixed. As a result, a deviation in the film thickness distribution formed on the substrate surface due to changes in distance from the evaporating source 3 to the substrate 2 does not occur in the direction of revolution of the substrate 2.

Furthermore, as mentioned above, since a deviation in the film thickness distribution due to changes in the solid angle φ from the evaporating source 3 does not occur in the direction of revolution of the substrate 2, according to the method of the invention, a deviation in the film thickness distribution in the direction of revolution of the substrate 2 can be suppressed to be small by a simple manner.

Although the evaporating source 3 is generally disposed at the center of revolution of the substrate 2, even when the evaporating source is not disposed at the center of revolution, this does not influence the effects of the invention. When the evaporating source is not disposed at the center of revolution, as a matter of course, distances from the respective positions in the direction of revolution within the substrate to the evaporating source are different in the condition that the substrate is at rest, however, since the substrate revolves in this invention, the time average of the distance becomes constant at positions within the substrate in the direction of revolution.

In order to improve the film thickness distribution in the direction perpendicular to the direction of substrate revolution, use of a film thickness correcting plate in the invention as with the prior art is permissible.

The radius of curvature when bending the substrates 2 may be almost the same as the radius of revolution of the substrates 2, and it is not particularly necessary to restrict the range thereof. However, in a case where the substrates 2 are made from a fragile material such as glass, there is a danger in that the substrates 2 are broken if the radius of curvature is small, so that the radius of curvature may be set to a degree at which the substrates 2 are not broken.

In order to make the invention practicable, radiuses of curvature that are permissible in terms of bending fracture in a case where the substrates 2 are made from glass are illustrated.

Assuming a case where a glass plate with a 1.1 mm through 0.3 mm thickness and a size of 530 mm×420 mm is bent so that the side of 530 mm is shaped into a cylindrical shape, radiuses of curvature at a degree with a fracture probability that is permissible in practical use are 700 mm in the case of a substrate with a 0.3 mm thickness, 1100 mm in the case of a substrate with a 0.5 mm thickness, and 2400 mm in the case of a substrate with a 1.1 mm thickness.

The average fracture stress of the glass plates having the abovementioned thicknesses is approximately 100 MPa, and the radiuses of curvature illustrated above cause a stress of approximately 25 MPa on the glass plates. Even when the glass plates are bent at the radiuses of curvature illustrated above, the probability of fracture of the glass plates is low.

Furthermore, the glass fracture follows a type of stochastic process and the fracture probability depends on the processes of processing the glass plates, so that it is appended herein where the radiuses of curvature mentioned above are illustrations in practical use, however, they do not guarantee quality against fracture.

Next, a method for attaching the substrates 2 to the substrate holder 1 in a bent condition is explained with reference to FIG. 2.

It is desirable that the substrate holder 1 is assembled into a cylindrical shape so that the substrates 2 can be bent at a radius of curvature equal to the radius of revolution of the substrates 2 by only attaching the substrates 2 along the shape of the inner wall surface of the substrate holder 1.

The material of the substrate holder 1 may be selected by considering properties such as proper heat resistance, rigidity, less dust emission, and free from emission of gases within the vacuum device. Various kinds of metal materials such as stainless steel and aluminum are generally used.

As described later, in order to fix the substrates 2 and protective sheets to the substrate holder 1 by using presser plates, the substrate holder is provided with a fixing means, not shown.

When attaching the substrates 2 to the substrate holder 1, it is preferable that protective sheets 8a with a hardness smaller than that of the substrates are interposed between the substrates 2 and substrate holder 1. Since the protective sheets 8a prevent direct contact between the substrates 2 and substrate holder 1, occurrence of flaws on the substrates 2 can be prevented, and since the protective sheets 8a have a hardness smaller than that of the substrates 2, the protective sheets 8a do not damage the substrates 2. As such protective sheets 8a, various plastic sheets may be used. Among them, a polyimide resin which does not generate gases so much within the vacuum device and has relatively high heat resistance is preferably used.

The reasons for avoiding emission of gases from members within the vacuum device are that emissions of water and organic gases other than an adjusted predetermined atmosphere makes it difficult to maintain a predetermined degree of vacuum that is required for formation of coating films, and furthermore, deteriorates the properties of formed coating films.

It is preferable that protective sheets 8b with a hardness smaller than that of the substrates 2 are also placed on the side of the substrates 2 on which coating films are formed. However, in this case, since apertures for forming coating films are necessary on the surface of the substrates, protective sheets 8b are processed into a trim shape.

Provision of the protective sheets 8b is also for preventing direct contact between the substrates 2 and presser plates 9 and occurrence of flaws on the substrates 2. For the same reason mentioned above, a polyimide resin is preferably used for the protective sheets 8b.

The presser plates 9 are bent at a radius of curvature that is roughly equal to that of the substrate holder 1, and processed into a trim shape since apertures for forming coating films are necessary on the substrate surfaces.

The presser plates 9 have a function for bending the substrates 2 within the elasticity range thereof and a function for fixing the substrates 2 and protective sheets 8 to the substrate holder 1 by pressing the substrates 2 against the substrate holder 1 together with the protective sheets 8.

When fixing the substrates 2 and protective sheets 8 to the substrate holder 1, since they are fixed by a fixing means (not shown) attached to the substrate holder 1 via presser plates 9, occurrence of flaws on the substrates 2 is prevented.

In order to bend the substrates 2 within the elasticity range and maintain the bent condition, for the presser plates 9, a material which has sufficient rigidity for supporting the reaction force from the substrates 2 may be selected.

Furthermore, an embodiment without using either one or both of the protective sheets 8a and 8b that are used for preventing occurrence of flaws on the substrates 2 is also preferable. Such an embodiment is preferable in a case where it is necessary to reduce influences from gas emission of the protective sheets 8a and 8b and reduce costs.

The film thickness distribution in the direction of substrate revolution can be improved by the method of the invention in a case where sputtering is used for forming coating films while revolving the substrates 2.

Figure 3:
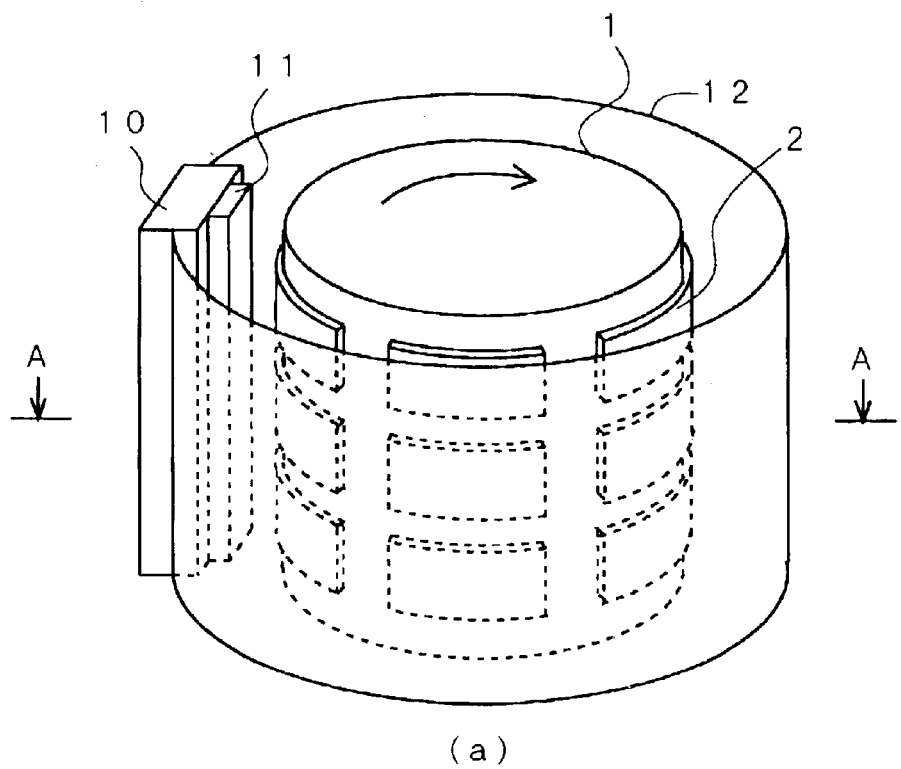
FIGS. 3 are a perspective view (FIG. 3(a)) of an evaporation device employing the sputtering method and a sectional view (FIG. 3(b)) along the A—A line of FIG. 3(a) in the embodiment of the invention.
Figure 3:
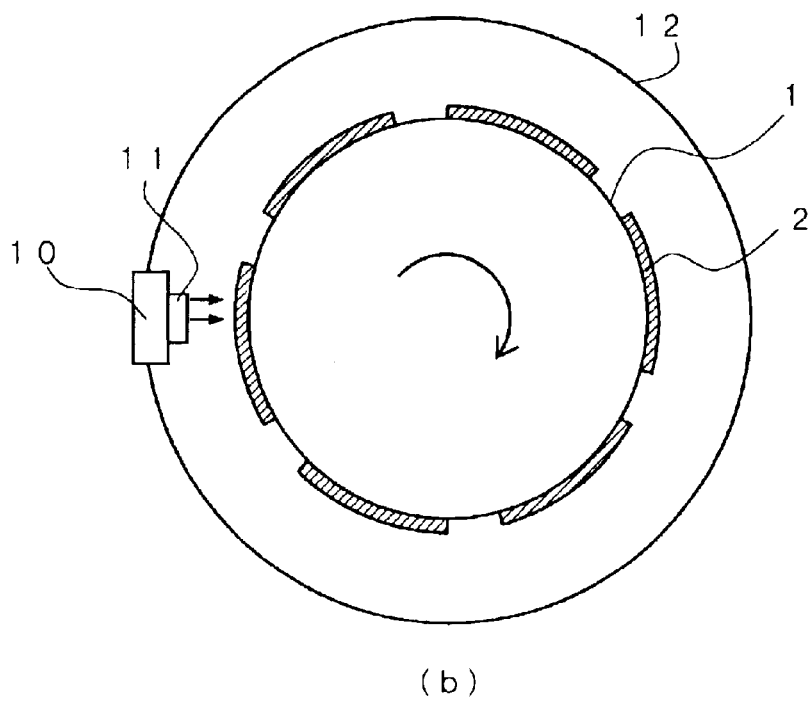

FIG. 3(a) is a schematic perspective view showing the embodiment of the invention using sputtering method, wherein a target 11 of a coating film material on a cathode 10 opposing the substrates 2 is attached to a chamber 12, a cylindrical substrate holder 1 is provided so as to rotate concentrically with the chamber 12, and the position of the target 11 with respect to the substrates 2 attached on the outer wall surface of said substrate holder 1 is shown.

The case of sputtering method is similar to the case of the vacuum evaporation method in the point that a deviation in the film thickness distribution due to the distances between the position of the coating film material (surface of the target 11) and the substrates 2 occurs although the case of sputtering method is different from the vacuum evaporation method in that a deviation in the film thickness distribution due to the cosine rule in accordance with the solid angle viewed from the position of the target 11 of the coating film material does not occur. Therefore, as in the prior art, if the substrates 2 are made plane and attached to the substrate holder 1, and then coating films are formed while revolving the substrates, a deviation in the film thickness distribution in the direction of revolution of the substrates 2 inevitably occurs.

As shown in the horizontal sectional view of FIG. 3(b) (along A—A line of FIG. 3(a)), by forming coating films in a condition where the substrates 2 are bent at the same radius of curvature as that of the radius of revolution thereof, since the distance between each position within one substrate 2 in the direction of revolution and the surface of the target 11 is always maintained to be constant, so that a deviation in the film thickness distribution in the direction of revolution of the substrates 2 is prevented.

The surface of the target 11 of the coating film material in the sputtering is regarded as a surface evaporating source or line evaporating source when it is compared with the size of the substrates 2. In a case where the target 11 is regarded as a line-evaporating source by comparison with the size of the substrate 2, the abovementioned great effect of the invention is obtained, however, if the target is regarded as a surface-evaporating source, the effect of the invention becomes relatively small.

EXAMPLE

Figure 6:
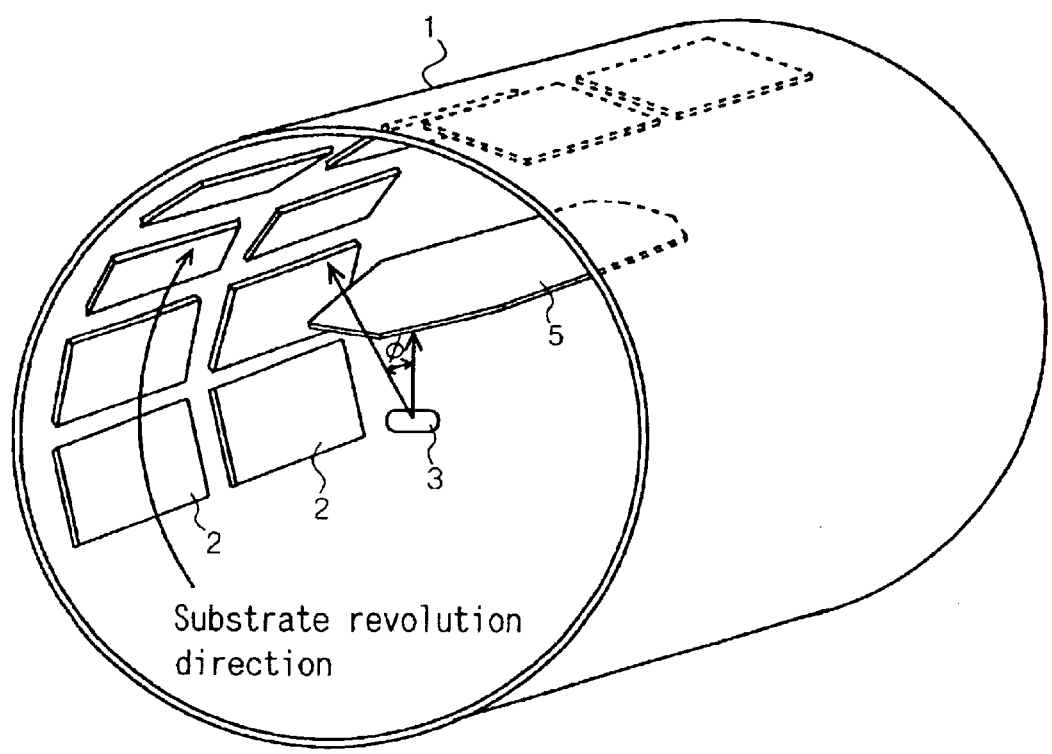
FIG. 6 is a perspective view of a vacuum evaporation device according to the prior art.
Figure 7:
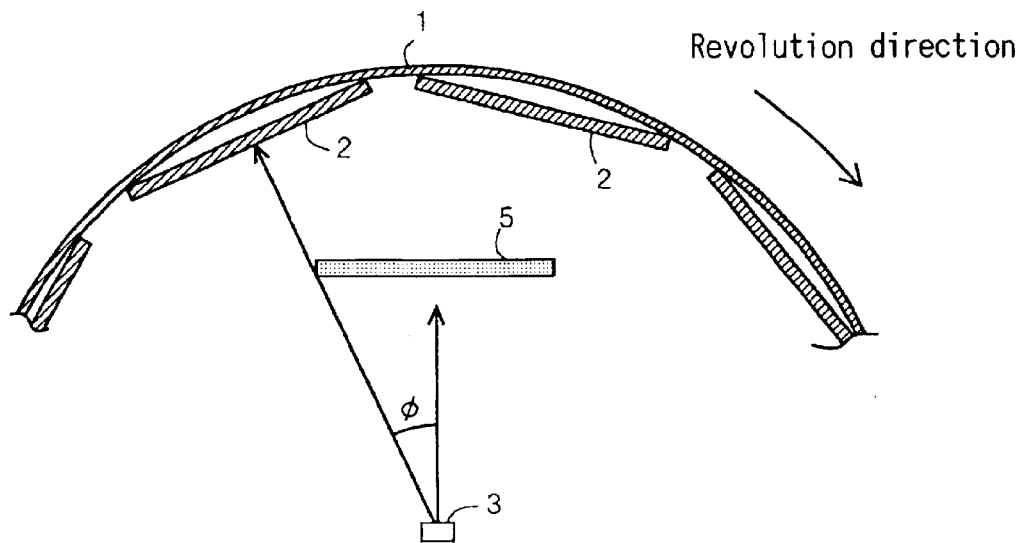
FIG. 7 is a partial sectional view of the vacuum evaporation device of FIG. 6.
Figure 8:
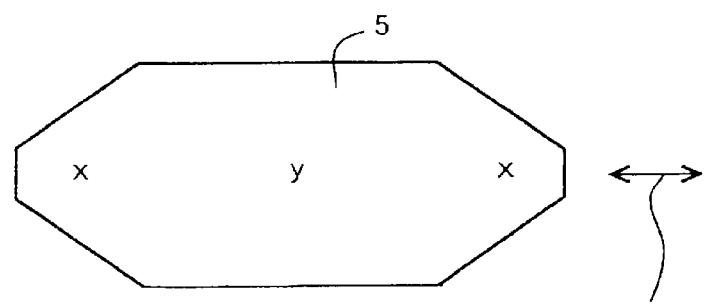
FIG. 8 is a plan view of a correcting plate of the vacuum evaporation device of FIG. 6.
Figure 9:
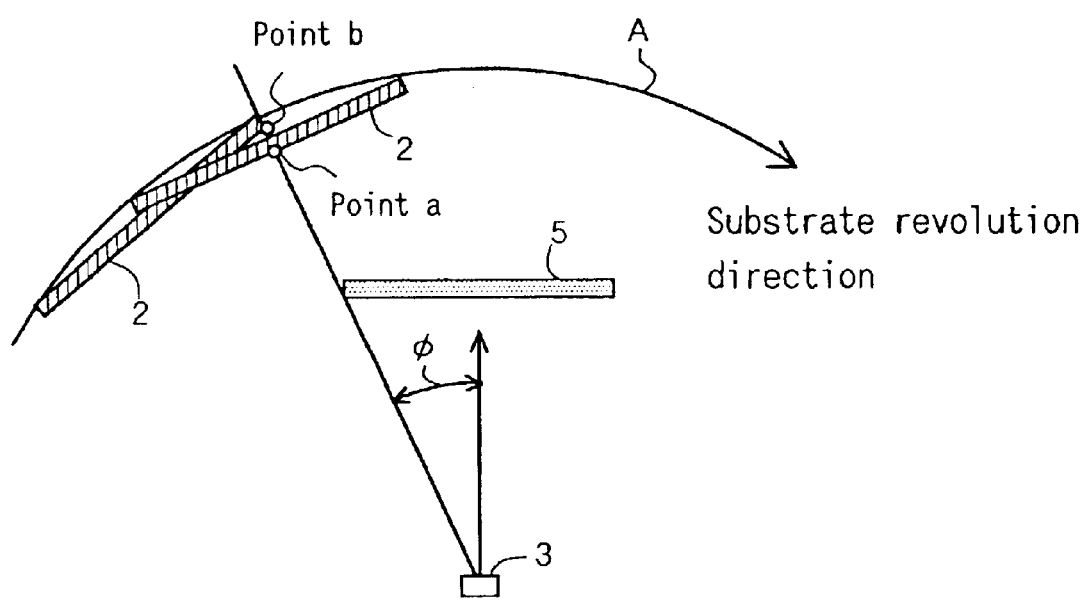
FIG. 9 is a partial sectional view of the vacuum evaporation device in order to explain nonconformity of the vacuum evaporation device according to the prior art.
Figure 10:
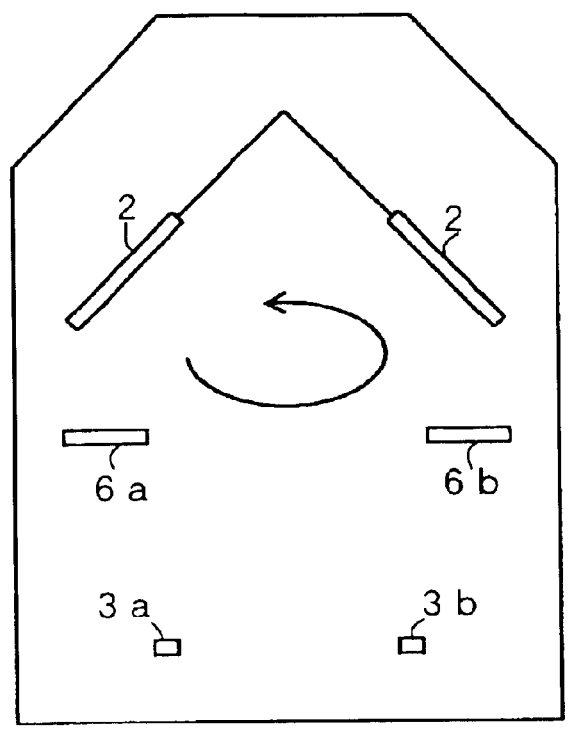
FIG. 10 is a sectional view of a vacuum evaporation device according to the prior art.
Figure 11:
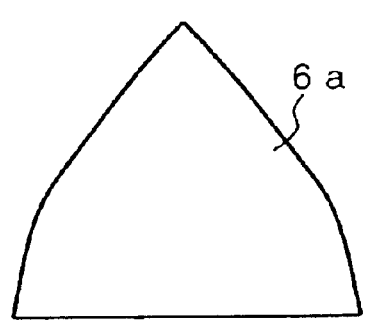
FIG. 11 are a plan view of correcting plates of the vacuum evaporation device of FIG. 10.
Figure 11:
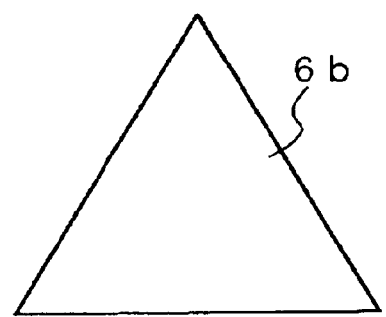

By using the vacuum evaporation device shown in FIG. 6, on a soda lime silicate glass substrate, an optical multilayered film which was formed a total of 12 laminated layers including 6 layers each of titanium oxide films and silicon oxide films alternately laminated, and had a total thickness of approximately 0.9 ìm was formed.

The optical multilayered film was optically designed to form a semi-transmission mirror that has a reflectance of approximately 75% and a transmittance of approximately 25% for visible light with a 530 nm wavelength.

A glass plate with a thickness of 0.5 mm and a size of 530 mm×420 mm was attached to a substrate holder 1 in a condition where the side of 530 mm was bent at a radius of curvature of 1100 mm.

As shown in FIG. 2, a polyimide-made protective sheet 8a with a thickness of 0.2 mm was placed on the inside surface of a cylindrical substrate holder 1 with a radius of 1100 mm, and the glass substrate 2 was placed thereon so that the side of 530 mm was in the direction of rotation of the substrate holder 1, and on the glass substrate, a polyimide-made protective sheet 8b that had a thickness of 0.2 mm and opened in a trim shape with an outer edge width of 5 mm was placed, and furthermore, a stainless steel-made presser plate 9 that had the same external dimensions as those of the glass substrate 2, a thickness of 1.0 mm, and opened into a trim shape with an outer edge width of 5 mm was placed, and the four corners of the presser plate 9 were inserted into the substrate holder 1 by using clips (not shown) and fixed. The presser plate 9 was bent in advance so as to have a radius of curvature of approximately 1100 mm.

Twelve glass substrates 2 were thus arranged on the inner wall surface of the substrate holder 1, and by the same method, twelve glass substrates 2 were further arranged in parallel with the row of the glass substrates that have been arranged, whereby a total of twenty four substrates 2 were attached.

Next, the abovementioned optical multilayered film was formed under the following evaporation conditions.

Material heating method: electron beam heating

Film thickness control method: crystal oscillator

Distance between the substrate 2 and evaporating source 3: 1100 mm

Temperature of the substrate 2 when forming a coating film: 260° C.

Speed of rotation of the substrate holder 1: 30 min$^{-1}$

Ultimate vacuum: $7.2 \times 10^{-3}$ Pa

After the predetermined optical multilayered film was formed, the substrate 2 was cooled, and then removed from the substrate holder 1, whereby a substrate 2 with a plane semi-transmission mirror was obtained.

The film thickness distribution of the coating film thus obtained was measured in the direction of revolution of the substrate 2. Measurement was made for the inside positions at 50 mm intervals excluding 15 mm of both ends in the direction of the 530 mm side of the substrate 2.

Figure 4:
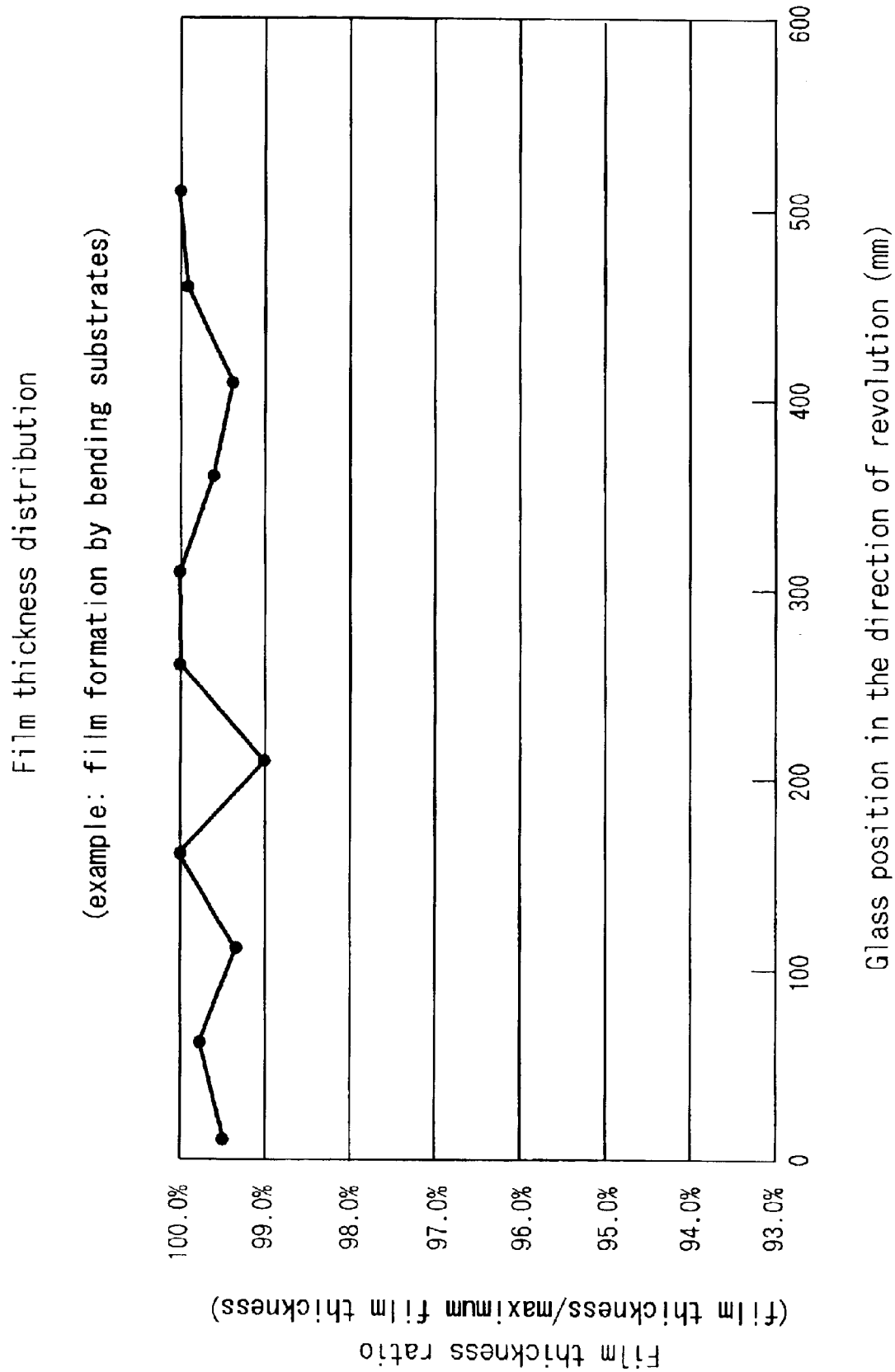
FIG. 4 is a diagram showing the film thickness distribution in the direction of substrate revolution based on the relationship between the film thickness ratio obtained by the evaporation method according to the embodiment of the invention and the substrate positions in the direction of substrate revolution.

The measurement results are shown in FIG. 4. The film thickness ratio in the direction of revolution of the substrate was 1% or less at the thinnest portion based on the thickest portion.

Comparative Example

A similar coating film was formed on the substrate 2 by the same procedures as in the abovementioned example except for using the method for attaching the glass substrate 2 of the prior art.

The substrate 2 was sandwiched by two plane presser plates 9 that were not subjected to bending processing in advance, and then the substrate 2 was attached to the substrate holder 1 so that the substrate became plane.

The film thickness distribution of the coating film thus obtained was measured in the direction of revolution of the substrate 2 in the same manner as in the example.

Figure 5:
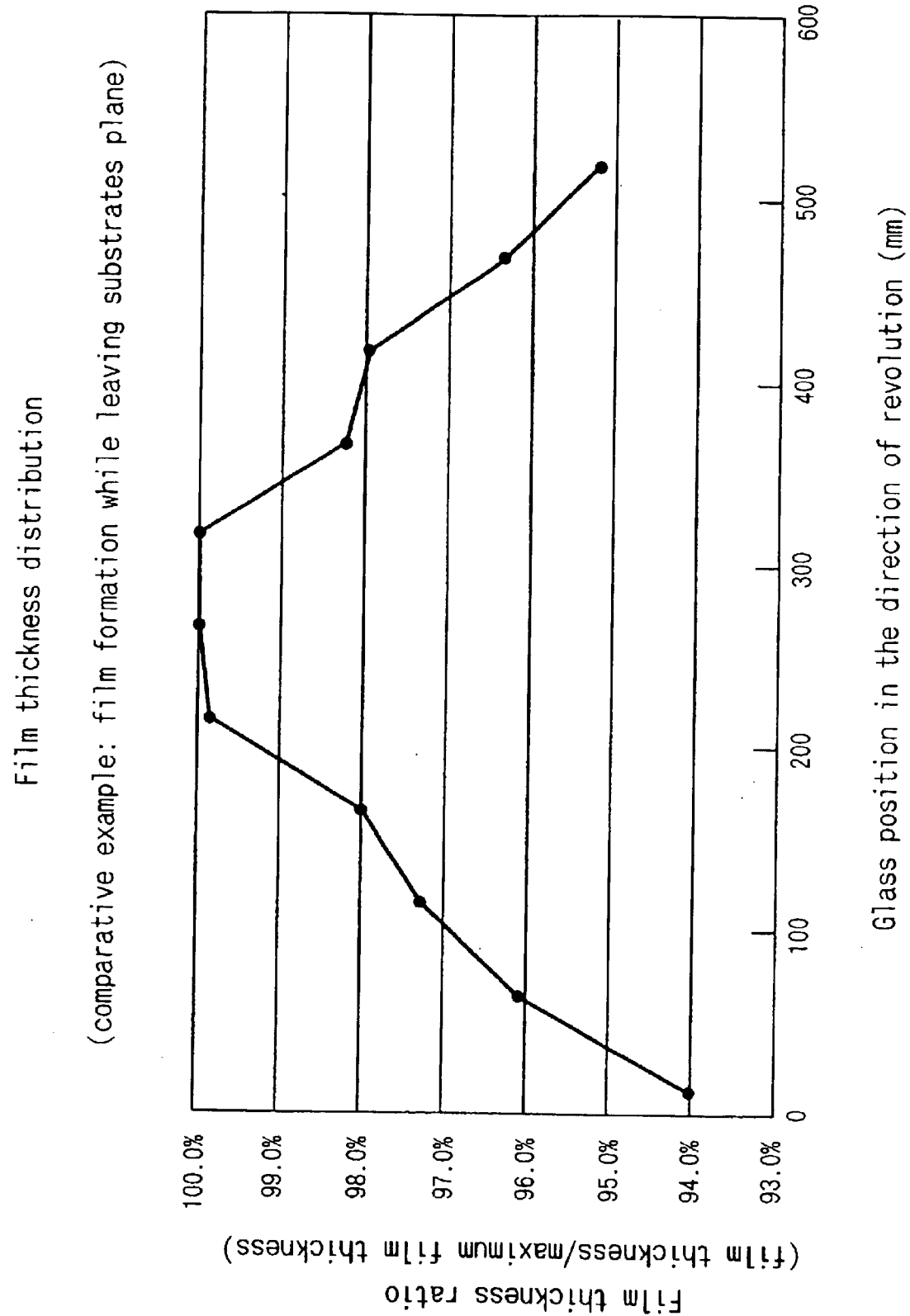
FIG. 5 is a diagram showing the film thickness distribution in the direction of substrate revolution based on the relationship between the film thickness ratio obtained by the evaporation method according to the prior art and the substrate positions in the direction of substrate revolution.

The measurement results are shown in FIG. 5. The film thickness ratio in the direction of revolution of the substrate 2 was 6% or less at the thinnest portion based on the thickest portion.

INDUSTRIAL APPLICABILITY

According to the invention, the radius of curvature of the substrates is made equal to the radius of curvature of the wall surface of the cylindrical substrate holder on which the substrates are disposed, whereby the thickness in the direction of substrate revolution from the evaporating source that is disposed at a predetermined distance from the revolving substrates becomes even.

What is claimed is:

1. A method for forming coating films, in which an evaporating source is provided at a predetermined distance from one or more substrates, and a coating film material from the evaporating source is applied on the substrate surfaces while revolving the substrates around the evaporating source, wherein coating films are formed on the substrate surfaces in a condition where the radius of curvature of the substrates obtained by bending the substrates within the elasticity range is almost equal to the radius of revolution of the substrates which rotate the substrates around the evaporating source.

2. A method for forming coating films according to claim 1, wherein the evaporating source is disposed at a center of revolution of the substrates or in the vicinity of a center of the revolution of the substrates.

3. A method for forming coating films according to claim 1, wherein the evaporating source is disposed at positions other than a center of revolution of the substrates or in the vicinity of a center of revolution of the substrates.

4. A method for forming coating films according to claim 1, wherein evaporation material to evaporate the coating film material by heating under reduced pressure, is used in an evaporating source.

5. A method for forming coating films according to claim 1, wherein a target to evaporate the coating film material by sputtering, is used in the evaporating source.

6. A coating film forming device having an evaporating source arranged section for evaporating a coating film material, and a cylindrical substrate holder which holds one or more substrates to be coated with the coating film material from the evaporating source on the wall of the holder and revolves around the evaporating source arranged section and is disposed at a predetermined distance from the evaporating source arranged section, wherein the radius of curvature of the substrates is almost equal to the radius of curvature of the wall surface on which the substrates of the cylindrical substrate holder are provided.

7. A coating film forming device according to claim 6, wherein the substrate holder is made of a metallic material.

8. A coating film forming device according to claim 6, wherein a trim-shaped presser plate fixes the substrates together with the wall surface of the substrate holder, and has a radius of curvature that is almost equal to that of the substrates is provided.

9. A coating film forming device according to claim 8, wherein a protective sheet with a hardness smaller than that of the substrate is deposited between the substrates and the wall surface of the substrate holder, and a trim-shaped protective sheet with a hardness smaller than that of the substrates is disposed between the substrate and the trim-shaped presser plate of the substrates.

10. A coating film forming device according to claim 9, wherein the protective sheet and the trim-shaped protective sheet are plastics.

11. A coating film forming device according to claim 6, wherein one or more substrates are provided on the inner wall surface of the cylindrical substrate holder which rotates around a rotation axis, and the evaporating source arranged section to evaporate the coating film material are provided at the cylindrical axis of substrate holder or in the vicinity of the cylindrical axis of the substrate holder.

12. A coating film forming device according to claim 11, wherein evaporation material to evaporate the coating film material by heating under reduced pressure is disposed at the evaporating source arranged section.

13. A coating film forming device according to claim 11, wherein a target to evaporate the coating film material by sputtering is provided at the evaporating source arranged section.

14. A coating film forming device according to 6, wherein one or more substrates are provided on the inner wall surface of the cylindrical substrate holder which rotates around a rotation axis, and the evaporating source arranged section to evaporate the coating film material are provided at positions other than the cylindrical axis of the substrate holder or in the vicinity of the cylindrical axis of substrate holder.

* * * * *